United States Patent
Kohlstedt et al.

(10) Patent No.: US 7,619,268 B2
(45) Date of Patent: Nov. 17, 2009

(54) FAST REMANENT RESISTIVE FERROELECTRIC MEMORY

(75) Inventors: Herman Kohlstedt, Julich (DE); Rene Meyer, Aachen (DE)

(73) Assignee: Forschungszentrum Julich GmbH, Julich (DE)

( * ) Notice: Subject to any disclaimer, the term of this patent is extended or adjusted under 35 U.S.C. 154(b) by 41 days.

(21) Appl. No.: 10/544,924

(22) PCT Filed: Jan. 7, 2004

(86) PCT No.: PCT/EP2004/000039

§ 371 (c)(1),
(2), (4) Date: Feb. 13, 2006

(87) PCT Pub. No.: WO2004/068499

PCT Pub. Date: Aug. 12, 2004

(65) Prior Publication Data

US 2006/0145225 A1    Jul. 6, 2006

(30) Foreign Application Priority Data

Jan. 28, 2003  (DE) ................. 103 03 316

(51) Int. Cl.
*H01L 29/92* (2006.01)
(52) U.S. Cl. ............... 257/295; 257/E27.104
(58) Field of Classification Search ............ 257/295, 257/E27.104
See application file for complete search history.

(56) References Cited

U.S. PATENT DOCUMENTS

| 5,541,422 A * | 7/1996 | Wolf et al. ............... 257/9 |
| 2002/0118573 A1* | 8/2002 | Pasotti et al. ........ 365/185.24 |
| 2003/0001176 A1* | 1/2003 | Li et al. ................ 257/295 |
| 2003/0056078 A1* | 3/2003 | Johansson et al. ......... 711/200 |

FOREIGN PATENT DOCUMENTS

| EP | 657936 A1 * | 6/1995 |
| JP | 2001085624 A * | 3/2001 |
| WO | WO 200243071 A * | 5/2002 |
| WO | WO 200245172 A * | 6/2002 |

OTHER PUBLICATIONS

Leo Esaki, "Long Journey Into Tunneling," Nobel Lecture, Dec. 12, 1973, pp. 119-120.*

* cited by examiner

*Primary Examiner*—Thomas L Dickey
(74) *Attorney, Agent, or Firm*—Ladas & Parry LLP

(57) ABSTRACT

Memory element consisting of an electrode (2), a ferroelectric layer (3) adjoining the latter, a layer (4) made from non-ferroelectric material adjoining the ferroelectric layer (3) and an electrode (5) adjoining the layer (4) made from non-ferroelectric material, wherein the ferroelectric layer is at least 10 nanometers thick, the electrical resistance, which is formed by the non-ferroelectric layer and the ferroelectric layer, depends upon the direction of polarization in the ferroelectric layer, and wherein the memory element comprises means for measuring the electrical resistance of the non-ferroelectric layer and the ferroelectric layer.

9 Claims, 3 Drawing Sheets

FAST REMANENT RESISTIVE FERROELECTRIC MEMORY

Figure 1A:
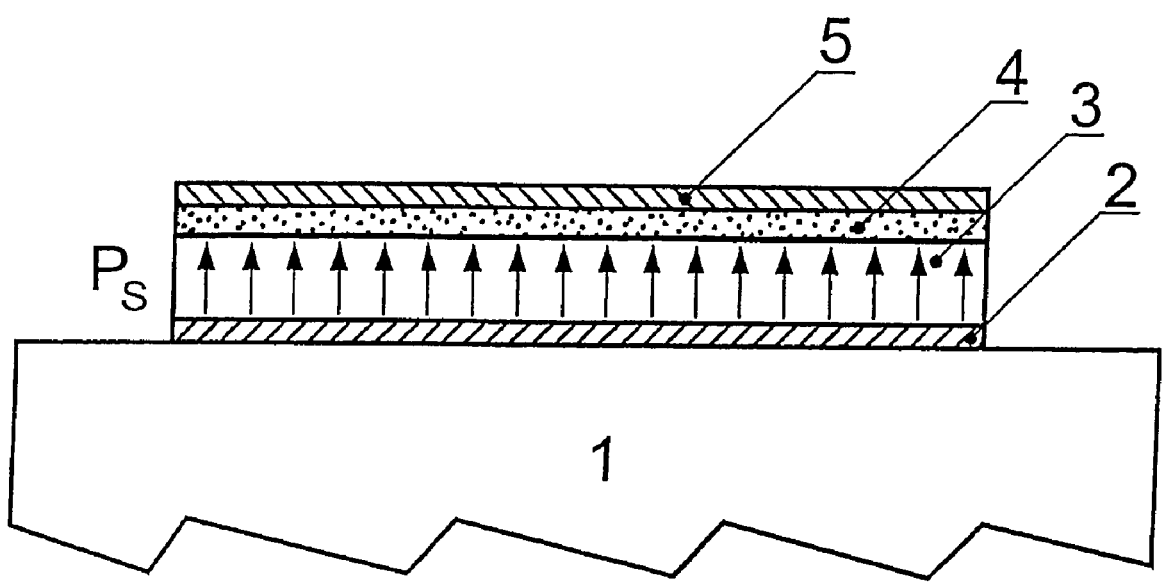

The invention relates to a memory for electronic storage of information and a storage method. Memories of this kind are already known. At present, CMOS-based, optional bulk-storage devices (SRAM/DRAM) are conventionally in use.

After switching off the supply voltage, an SRAM or DRAM memory element loses its information. The aim is to provide memory elements, which retain the contents of their memory even after a supply voltage has been switched off.

The term optional bulk-storage device is understood to mean that the information need not be read out of the individual memory elements in a sequential manner, as is the case with a hard disk. In a bulk-storage device of this kind, which comprises many individual memory elements, it is therefore possible to write to and/or read from a selected memory element in a targeted manner.

So-called FLASH memory elements are used to retain the contents of a memory even after a supply voltage has been switched off. A FLASH memory element comprises a CMOS transistor. The transistor has a so-called FLOATING gate. This is understood as a gate, which is initially not electrically connected to its surroundings. Charge is conducted to the FLOATING gate via a tunnel process. The tunnel process is set in motion by the application of a very high voltage. Following this, the charge disposed in the FLOATING gate can no longer escape. The information therefore remains stored regardless of whether a supply voltage is connected or not.

The high voltage is problematic. Furthermore, writing to a FLASH memory element requires a relatively long time. The number of write cycles is relatively low.

The aim is to combine the memory capabilities of a FLASH memory element with the rapid reading and writing times, which are possible with the SRAM memory element mentioned above.

FeRAM and MRAM memory elements have been developed to achieve this aim.

An FeRAM memory element is structured as follows. For example, a layer made from ferroelectric material is provided. This layer is in contact with electrodes at both sides. The ferroelectric material has a direction of polarisation, which can be reversed by the application of a voltage to the electrodes. The voltage must provide the polarity and magnitude appropriate for this purpose. The coercive voltage is therefore applied, in order to bring about the reversal of the polarisation. The direction of the polarisation corresponds to the digitally-stored information (0 or 1).

To read out the information, a voltage is applied, which is large enough to cause a reversal of the direction of polarisation. If the direction of polarisation is reversed, a charge of corresponding magnitude flows for a short time. The quantity of charge is determined by measuring the voltage change across a capacitor. If a voltage change of this kind is registered, it can be inferred, that the direction of polarisation has been reversed. It is evident that the polarisation condition before the application of the voltage was present in reverse. If only a very small quantity of charge flows when the corresponding the voltage is attached, it can be inferred that no reversal process has taken place. This also determines the direction of polarisation, and the stored condition has therefore also been read out.

Reducing the area of the FeRAM memory element reduces the quantity of charge, which leads to problems in miniaturisation.

A reversal of the polarisation when reading out through the application of a coercive voltage, changes the stored information. After the information has been read out, it must be stored in the corresponding memory cell again. With an FeRAM memory element, it is therefore disadvantageous that the content of the memory cannot be read out without being destroyed.

Reading an item of information into the memory again costs time. This reduces the writing and reading times for an FeRAM memory element. Furthermore, current is required for re-reading into the memory. This is also disadvantageous.

Further disadvantages of an FeRAM memory element are, firstly, the loss of a stored item of information during the course of time and, secondly, the loss of the capability for storing information at all.

So-called MRAM memory elements also provide a fast memory element, which retains its information after the supply voltage has been switched off. In an MRAM memory element, a hard-magnetic layer with a predetermined direction of magnetisation is separated from a soft-magnetic layer by a tunnel contact. The direction of magnetisation of the soft-magnetic layer can be reversed by the application of an appropriate magnetic field. The magnetic field is generated by an electrical current. The electrical resistance of the tunnel contact depends upon whether the direction of magnetisation in the soft-magnetic layer is parallel or anti-parallel to the direction of magnetisation in the hard-magnetic layer. The information is therefore read out by determining an electrical resistance, which is formed through the tunnel contact. An MRAM memory element is therefore referred to as a resistive memory element. The information content is accordingly determined by measuring an electrical resistance. This must be distinguished from the memory elements, such as the FeRAM memory element named above, which are referred to as charge-based memory elements.

Resistive memory elements are essentially superior to charge-based memory elements. For example, resistive memory elements can be miniaturised more simply.

One disadvantage of an MRAM memory element is a pronounced crosstalk during the writing of the information. This is understood to mean, that, during the writing of an item of information, adjacent memory elements in a bulk-storage device are influenced thereby undesirably changing the information stored there. It is disadvantageous that a tunnel contact must be generated, leading to relatively high production costs. Increasing the switching cycles causes an undesirable rotation of the magnetisation in the hard magnet, which leads to the failure of the memory cell.

The object of the invention is to create a fast, remanent memory for the storage of digital information and to provide an associated storage method.

The object is achieved by a memory element with the features of claim 1. Advantageous developments are specified in the subordinate claims.

The memory element of the type according to the invention is structured as follows:

A memory element is contacted by an electrode from both sides. The actual memory element comprises at least one ferroelectric layer and one non-ferroelectric layer adjoining the latter. One electrode then contacts the ferroelectric layer and the other electrode contacts the non-ferroelectric layer. A sufficiently weak ferroelectric layer can also be used instead of the non-ferroelectric layer to achieve the effect according to the invention.

The information is written by switching the direction of polarisation in the ferroelectric layer into the corresponding direction. One direction of polarisation corresponds to the "1" information. The other direction of polarisation corresponds to the "0" information.

The direction of polarisation is switched into the desired direction by applying a corresponding voltage to the two electrodes. The voltage must have a magnitude and direction appropriate for this purpose.

Since the information is written through the application of a voltage, the problem of crosstalk encountered with the MRAM memory element does not occur.

The electrical resistance, which is formed by the non-ferroelectric layer and the ferroelectric layer, depends upon the direction of polarisation in the ferroelectric layer. In order to read out the memory element, for example, a voltage is applied to the electrodes, and the flow of current is measured. The electrical resistance determined in this manner or otherwise represents a measure for the direction of polarisation and therefore a measure for the information stored.

By contrast with FeRAM memory elements, the information is therefore read out in a resistive and therefore non-destructive manner. Accordingly, the information is also retained after reading out. An item of information, which has been read out, need not be stored again. By comparison with a FeRAM memory elements, this provides advantages of speed.

If the size of the memory element according to the invention is reduced, the resistance is indeed changed. However, with the component according to the invention, by changing the conductivity of the materials used and/or through the choice of appropriate electrodes, the resistance can be adapted to allow miniaturisation of the memory element in such a manner that the difference in resistance is determined dependent upon the direction of polarisation. Miniaturisation of the components of the type according to the invention is therefore possible without difficulty by comparison with FeRAM memory elements.

The change in resistance, which is associated with a change in the direction of polarisation in the ferroelectric material, can be a factor of two or more without difficulty. It is even possible to achieve changes in resistance, which differ by a factor of 10 to 100 or more. Reading out an item of information is therefore not problematic.

Furthermore, it has been shown that interfering influences associated with the engineering of FeRAM memory elements do not occur with the memory element according to the invention or can even be exploited in a positive manner.

In order to operate the memory element according to the invention at high frequencies, a small electrical resistance is required. By contrast with FeRAM memory elements, it is therefore advantageous in this context, if the electrical resistance of the ferroelectric and non-ferroelectric layer is small. An electrical resistance in the sense of the invention is small, if it is possible to read out at high clock frequencies. The possible clock frequencies are, in particular, around 100 MHz and above. In other words, if it is not possible to read out a memory element according to the invention at frequencies above 100 MHz, then a small resistance in the sense of the invention is not present.

Ferroelectric inorganic compounds, especially oxides with a perovskite structure or perovskite-like structure or ferroelectric polymers are preferred as materials for provision of the ferroelectric layer. Furthermore, ferroelectric liquid-crystals are also possible.

Ferroelectric polymers are preferable if a memory element of the type according to the invention is to be provided in a cost-favourable manner. Ferroelectric oxides are preferable if a memory element according to the invention, which is particularly fast, that is to say, with which information can be written and/or read particularly fast, is required. Examples of particularly advantageous ferroelectric oxides are $PbZr_xTi_{1-x}O_3$, $Ba_{1-x}SrTiO_3$ and $BaTiO_3$, $SrBi_2Ta_2O_9$, $K_xWO_3$ and $Bi_4Ti_3O_{12}$. To achieve a particularly good, long-term stability, $PbZr_xTi_{1-x}O_3$ and $SrBi_2Ta_2O_9$ are particularly preferred. Examples of particularly advantageous ferroelectric polymers are PVDF, PVDF-TFE $[CH_2CF_2]_n$. PVDF is particularly preferred. Memories for flexible applications, such as flexible chip cards or smartcards, can be manufactured particularly well from these substances.

If particularly fast memory elements of the type according to the invention are required, the so-called low-∈-ferroelectric substances are selected as the material for the ferroelectric layer. The dielectric constant ∈ is small, if ∈ is smaller than 100.

Compounds with a perovskite or perovskite-like structure such as the following are suitable as ferroelectric materials:

$PbZr_xTi_{1-x}O_2$ [PZT]* Example for particularly good long-term stability $SrBi_2Ta_2O_9$ [SBT]* Example for particularly good long-term stability $Ba_{1-x}Sr_xTiO_3$ $Ba_{1-x}Pb_xTiO_3$ Ferroelectric niobate crystals of the formula $PbNb_2O_6$, Ferroelectric crystals with a tungsten-bronze structure of the formula $K_xWO_3$ and $Na_xWO_3$ wherein x<1, Ferroelectric crystals such as $Bi_4Ti_3O_{12}$, $Gd_2(MoO_4)$, $Pb_5Ge_3O_{11}$ Or Compounds of the $KTiOPO_4$ family or Ferroelectric semiconductors (SbSi family) and Organic ferroelectric substances, such as polymers:

Polyvinylidene fluorides (PVDF)

Polyvinylidene fluoride trifluoroethylene (PVDF-TFE)

Cyanopolymers

Odd-numbered nylons $(CH_2CF_2)_n$ wherein n>=1

Water-soluble ferroelectric crystals of the $KH_2PO_4$ family (KDP) or $(NH_2CH_2COOH)_3 \times H_2SO_4$— family (TGS)

Suitable non-ferroelectric materials are, for example:

Conductive polymers:

Doped polypyrrols (PPy)

Doped polyanilines

Doped polythiophenes, e.g. PEDOT (poly(3,4-ethylene dioxythiophenes)

Conductive oxides:

$IrO_x$, $RuO_x$, semiconductors, especially, Si, $Ta_xO_y$, $SiN_4$, $Ti_3N4$, a-Si, $SrO_x$, $SrRuO_3$, $LaNiO_3$, $La_{1-x}Sr_xCoO_3$, $La_{1-x}Ca_xMnO_3$, $La_{1-x-y}Sr_xCa_yMnO_3$, $LaCo_{1-x}Mn_xO_3$.

Doping with a non-ferroelectric layer is advantageous. For a cost-favourable component, polymers such as PPy or PEDOT are preferred as a non-ferroelectric material, which is electrically conductive. PPy is particularly advantageous, because it leads to a higher crystallinity of the ferroelectric layer, thereby achieving higher values for the ferroelectric polarisation.

If a particularly fast component or memory element of the type according to the invention is required, doped $SrTiO_4$ is preferred as the non-ferroelectric material. La, Nb are particularly suitable as the doping material. In one embodiment of the invention, the non ferroelectric layer should have a thickness of at least 1 angstrom. Thicknesses of at least one nanometre are particularly preferred. Thicknesses above 20 nm can be advantageous. The ferroelectric layer should be at least one nanometre thick. Thicknesses of at least 10 nanometres are particularly preferred. The overall memory element without the electrodes should be no thicker than 5 µm, by particular preference no thicker than 500 nanometres, by quite particular preference, no thicker than 200 nanometres.

The thinner the non-ferroelectric layer is, the smaller the change in resistance brought about by a reversal of the polarisation will be. At the same time, however, correspondingly faster readout times are possible. Accordingly, if a memory element of the type according to the invention with particularly fast readout times is required, the non-ferroelectric layer should be relatively thin. A non-ferroelectric layer is particularly thin, if it is thinner than the ferroelectric layer. Moreover, it is thin, if the thickness is less than 30 nanometres, preferably less than 5 nanometres. By particular preference, the non-ferroelectric layer should be at least twice as thin as the ferroelectric layer.

The requirements for the ferroelectric layer are similar. The thinner the ferroelectric layer is, the smaller the associated change in resistance brought about by a reversal of the polarisation will be. However, faster readout times are possible with smaller ferroelectric-layer thicknesses. Accordingly, if a component or memory element with particularly fast readout times is required, the layer thickness of the ferroelectric layer should be small. A thickness of the ferroelectric layer is particularly small, if it is below 30 nanometres. Moreover, the layer thickness is particularly small, if it is smaller than the layer thickness of the non-ferroelectric layer.

In a further embodiment, the ferroelectric layer and the non-ferroelectric layer are both thin.

Large changes of resistance are relevant, if the information is to be readable in a particularly reliable manner, if the component is to be used within large temperature ranges and/or is to be insensitive to radiation.

In a further embodiment of the invention, the ferroelectric layer is in contact on both sides with a non-ferroelectric layer. In this case, a minimum voltage is required to bring about a change in resistance when the polarisation is reversed. As a result of the minimum voltage required, if non-ferroelectric conductive layers are provided on both sides, the first-named embodiment is, however, preferable.

Materials, which provide a low contact resistance with the adjoining layers of the memory element, are preferable as the material of the electrodes. Low contact resistances can be provided by a low contact potential or by a tunnel contact. A contact potential is low, if the work function of the material of the electrode, which can, in particular, comprise a metal, differs from the electron affinity of the layer by less than 0.5 electron volts. Many metals provide a suitable work function. Electrically conductive oxide electrodes may also be considered. Oxide electrodes are advantageous, because the conductivity of the contact/contacts can be adjusted more readily. The required properties of the memory element can be provided by adjustment. Oxide electrodes are preferred, if they adjoin oxides.

In one embodiment, the component according to the invention is applied to a substrate. The lower electrode is then disposed on the substrate. The ferroelectric layer adjoins this first, and the non-ferroelectric layer is disposed above this (or vice versa). The so-called TOP electrode is disposed above these. This expediently consists of metal, because manufacture is then particularly simple. The lower electrode, also referred to as the BOTTOM electrode, expediently consists of oxide material. However, it can also consist of metal.

In a further embodiment of the invention, the TOP electrode preferably adjoins the non-ferroelectric layer. This opens up a relatively wide range of choices with regard to the materials used. A memory element, for example, with appropriately optimised properties adjusted to the relevant application, can be provided in this manner.

In this case (FIG. 1), the non-ferroelectric (or weakly-ferroelectric) layer can be formed by low-temperature deposition. Semiconductor materials such as doped silicon can be deposited in this manner. If the non-ferroelectric layer adjoins the top electrode, the epitaxial growth conditions for the ferroelectric layer are not negatively influenced.

If polymers are used, it is advantageous, if the ferroelectric layer adjoins the top electrode. In this case, the ferroelectric polymer is applied to the non-ferroelectric polymer, thereby increasing the crystallinity of the ferroelectric layer. This improves the ferroelectric properties.

In one advantageous embodiment of the invention, the non-ferroelectric layer and/or the ferroelectric layer are doped. This adjusts the conductivity and increases the long-term stability of the component according to the invention.

In the case of oxides, the ferroelectric layer is preferably monocrystalline or columnar. However, it can also be polycrystalline. If polymers are used, a polycrystalline structure is preferable. The following advantages are achieved through the choice of the relevant structure. In oxides, manufacturing columnar layers with a high remanent polarisation is simpler (more cost-favourable) than manufacturing monocrystalline layers. Furthermore, the switching behaviour and the value of the remanent polarisation can be influenced via the microstructure.

If the polarisation in the ferroelectric layer is only partially switched, not only can "0" or "1" information be stored, but intermediate states can also be stored. The memory density is therefore increased. It is advantageous to provide columnar layers. A columnar layer is therefore preferable, if a particularly high memory density is required. A columnar layer is a column-like structure, in which the columns point from one electrode towards the other electrode. Each column is structured in a monocrystalline manner. A crystallographic dislocation exists between the individual columns.

In order to achieve the different polarisation states, for the provision of a large memory density, it is necessary to provide a defined quantity of charge for writing. Current is therefore supplied in a defined quantity.

Advantages of the various dopings:
Weak doping: large change in resistance, high resistance-> particularly safe and current-saving Strong doping: low resistance, smaller change in resistance->very fast, very suitable for miniaturisation.

With oxide layers, doping with donors is particularly suitable, because this reduces the density of weakly-mobile lattice vacancies in the oxide, thereby significantly improving the cycle number and the long-term stability of the memory element.

Donor-doped strontium titanate (n-STO) in combination with PZT/SBT is particularly suitable as the conductive non-ferroelectric layer, because it provides a low lattice defect adaptation to PZT or SBT and, during manufacture, no interfering foreign phases occur at the boundary with the ferroelectric layer. Lanthanoids, Nb and V may be considered as doping substances.

La and Nb are particularly favourable donors because of their valency stability.

The ferroelectric layer is preferably thicker than the non-ferroelectric layer, if large changes in resistance are desirable for the reasons named above. This means that storage and reading out of information are particularly reliable.

EXEMPLARY EMBODIMENT

Figure 1B:
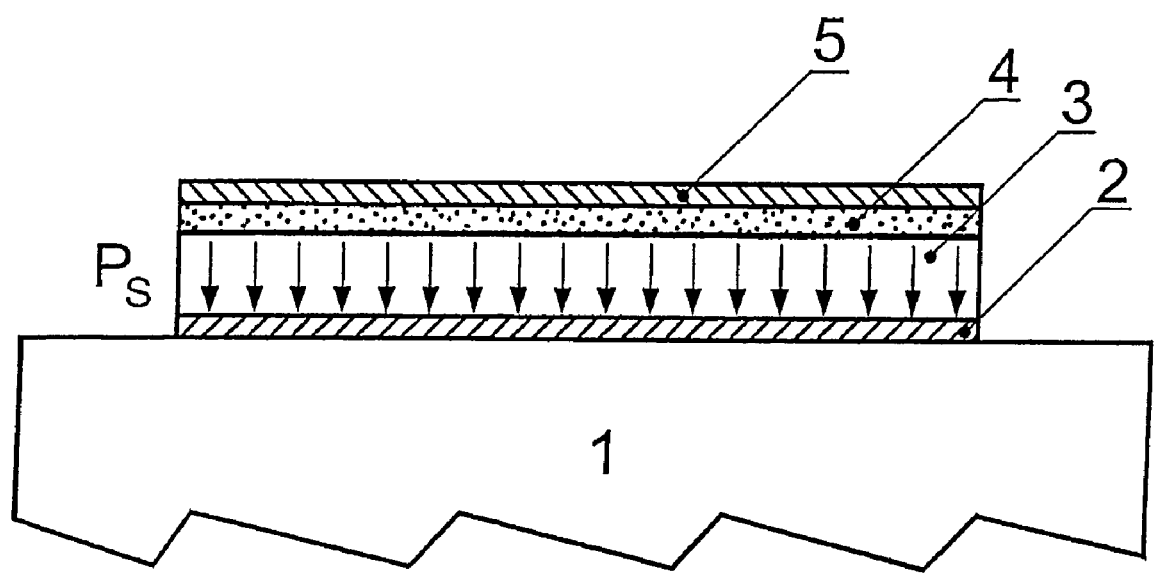

FIG. 1a,b shows in section a substrate 1, on which a bottom electrode 2 is disposed. This consists of an electrically conductive, oxide material. A columnar layer 3 made of ferroelectric material is applied to the bottom electrode. A layer 4 of non-ferroelectric material is disposed above this. Finally, the structure of the memory element is completed with the top electrode 5.

Figure 2:
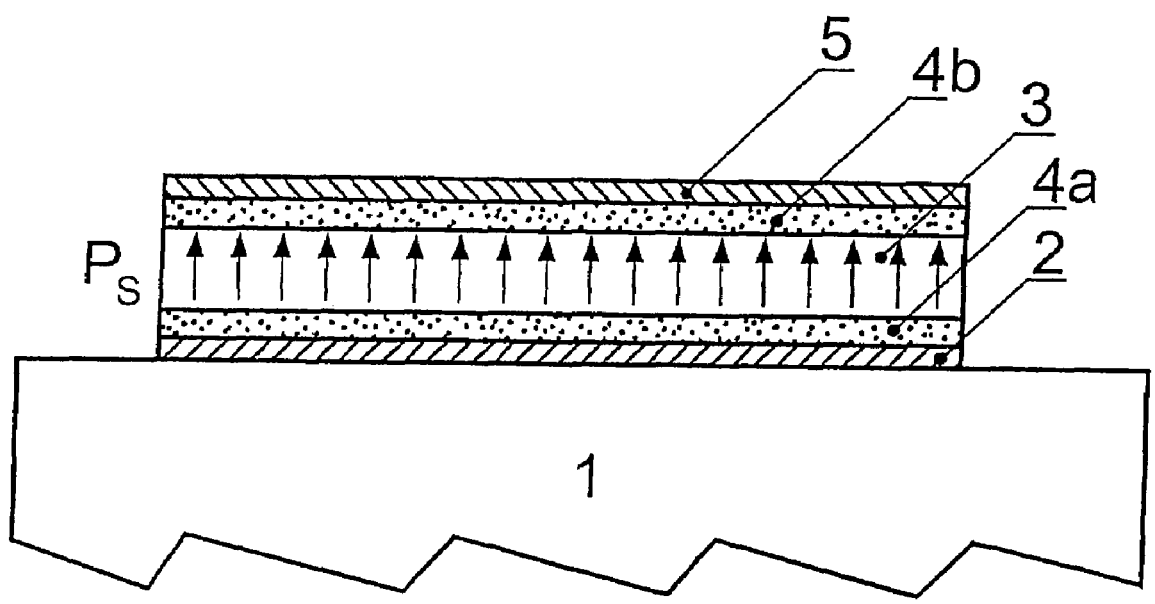

FIG. 2 shows a further exemplary embodiment with two non-ferroelectric layers 4*a* and 4*b*.

The invention claimed is:

1. A method for electronic storage and retrieval of information, wherein an item of information is written to a memory element, comprising the steps of:
    forming the memory element of an electrode with an electrode, a ferroelectric layer adjoining the electrode, a layer made from non-ferroelectric material adjoining the ferroelectric layer, and an second electrode adjoining the layer made from non-ferroelectric material, wherein the ferroelectric layer is at least 10 nanometers thick;
    writing an item of information to the memory element by aligning a polarization in a polarizable layer; and
    reading out the item of information in a non-destructive manner without affecting the aligned polarization through a resistance determination performable at a clock frequency of at least 100 Mhz.

2. The method of claim 1, wherein the ferroelectric layer is formed from an oxide of perovskite structure or a polymer.

3. The method of claim 2 wherein the ferroelectric layer if formed from PVDF-TFE or $(CH_2)_n$PVDF.

4. The method of claim 1 wherein the non-ferroelectric layer is formed from at least one of an electrically-conductive polymer chosen from doped polypyrrols, doped polyanilines and doped polythiophenes or an electrically-conductive oxide.

5. The method of claim 1 wherein the non-ferroelectric layer is formed to be at least 1 angstrom thick.

6. The method of claim 5 wherein the non-ferroelectric layer is formed to be at least 1 nanometer tick.

7. The method of claim 1 wherein the ferroelectric layer and the non-ferroelectric layer together are formed no ticker than 5 μm.

8. The method of claim 1 wherein the ferroelectric layer and the non-ferroelectric layer together are formed no ticker than 500 nanometers.

9. The method of claim 1, wherein the memory element is formed to have an inter-electrode resistance below a level defined by a detectable tunnel current.

* * * * *